(12) United States Patent
Yasui

(10) Patent No.: US 8,286,045 B2
(45) Date of Patent: Oct. 9, 2012

(54) TEST APPARATUS AND TEST METHOD

(75) Inventor: Takahiro Yasui, Gunma (JP)

(73) Assignee: Advantest Corporation, Tokyo (JP)

( * ) Notice: Subject to any disclaimer, the term of this patent is extended or adjusted under 35 U.S.C. 154(b) by 203 days.

(21) Appl. No.: 12/943,812

(22) Filed: Nov. 10, 2010

(65) Prior Publication Data

US 2011/0087934 A1    Apr. 14, 2011

Related U.S. Application Data

(63) Continuation of application No. PCT/JP2009/002085, filed on May 13, 2009.

(30) Foreign Application Priority Data

Jun. 2, 2008    (JP) .................................. 2008-144583

(51) Int. Cl.
    *G01R 31/28*    (2006.01)
(52) U.S. Cl. ...................... 714/738; 714/718
(58) Field of Classification Search .................. 713/401; 324/750.01; 714/743, 718, 720, 739, 724
    See application file for complete search history.

(56) References Cited

U.S. PATENT DOCUMENTS

| | | | | |
|---|---|---|---|---|
| 4,862,460 A | * | 8/1989 | Yamaguchi .................... | 714/743 |
| 5,208,416 A | * | 5/1993 | Hayakawa et al. ............. | 84/634 |
| 5,432,797 A | * | 7/1995 | Takano .......................... | 714/718 |
| 5,581,177 A | | 12/1996 | Hussey et al. | |
| 5,682,390 A | * | 10/1997 | Housako et al. .............. | 714/720 |
| 5,682,393 A | * | 10/1997 | Ohsawa ........................ | 713/401 |
| 6,006,349 A | | 12/1999 | Fujisaki | |
| 6,769,083 B1 | | 7/2004 | Tsuto et al. | |
| 7,135,880 B2 | * | 11/2006 | Negishi .................... | 324/750.01 |

FOREIGN PATENT DOCUMENTS

| | | |
|---|---|---|
| JP | 6-36598 A | 2/1994 |
| JP | 8-146088 A | 6/1996 |
| JP | H9-43317 A | 2/1997 |
| JP | 2001-194431 A | 7/2001 |
| JP | 2002-150792 A | 5/2002 |
| KR | 10-0307664 B1 | 10/2001 |

OTHER PUBLICATIONS

Korean Office Action dated Oct. 4, 2011, in a counterpart Korean Patent application No. 10-2010-7025608.
International Search Report (ISR) issued in PCT/JP2009/002085 (parent application) mailed in Aug. 2009 for Examiner consideration.
Written Opinion (PCT/ISA/237) issued in PCT/JP2009/002085 (parent application) mailed in Aug. 2009.

\* cited by examiner

*Primary Examiner* — David Ton
(74) *Attorney, Agent, or Firm* — Chen Yoshimura LLP

(57) ABSTRACT

A test apparatus testing a device under test includes a main pattern generating section that generates a main pattern, a plurality of sub-pattern generating sections each of which generates a sub-pattern corresponding to a different one of segment cycles based on a main pattern, the segment cycles formed by dividing a test cycle period, a test signal supplying section that supplies, to the device under test, a multiplexed test pattern formed by switching sub-patterns generated by the plurality of sub-pattern generating sections at each of the segment cycles, and a plurality of delay selecting sections each of which selects one of a main pattern that is from the main pattern generating section and a delayed main pattern that is formed by delaying the main pattern from the main pattern generating section by a test cycle, to supply the selected one to the corresponding sub-pattern generating section.

7 Claims, 5 Drawing Sheets

TEST APPARATUS AND TEST METHOD

BACKGROUND

1. Technical Field

The present invention relates to a test apparatus and a test method. The invention relates to, in particular, a test apparatus for testing a device under test and a test method thereof.

2. Related Art

Semiconductor memory such as DRAM can perform a burst transfer in which pieces of data can be uninterruptedly transferred based on information of one address. Japanese Patent Application Publication H.9-43317 (Patent Document 1) is an example of related art. Patent Document 1 discloses a test apparatus testing such semiconductor memory.

A pattern generator provided in the test apparatus described in Patent Document 1 generates a main pattern at a low-speed test cycle and concurrently generates a plurality of sub-patterns for the main pattern at each generation of the main pattern. The pattern generator then multiplexes the plurality of sub-pattern and outputs them.

The test apparatus equipped with such pattern generator can supply data to a memory under test at a high transfer rate while it operates at a low-speed test cycle.

The pattern generator described in Patent Document 1 generates sub-patterns for an initial segment cycle of the test cycle by just delaying the main pattern. When such pattern generator generates a test pattern for the burst transfer, the test apparatus has to run an test program which is adjusted, by inserting a dummy cycle and so forth, to generate initial sub-patterns of the burst transfer are generated in the initial segment cycle of the test cycle. Thus, testing performed by the test apparatus of Patent Document 1 takes a long period, and design freedom of test programs is limited.

SUMMARY

Therefore, it is an object of an aspect of the innovations herein to provide a test apparatus including a main pattern generating section that generates a main pattern used for testing the device under test at each test cycle, a plurality of sub-pattern generating sections each of which generates a sub-pattern corresponding to a different one of segment cycles based on a main pattern, the segment cycles formed by dividing a test cycle period, a test signal supplying section that supplies, to the device under test, a multiplexed test pattern formed by switching sub-patterns generated by the plurality of sub-pattern generating sections in each of the segment cycles; and a plurality of delay selecting sections each of which selects one of a main pattern that is from the main pattern generating section and a delayed main pattern that is formed by delaying the main pattern from the main pattern generating section by a test cycle to supply the selected one to a corresponding one of the sub-pattern generating sections. It is also an object of an aspect of the innovations herein to provide a testing method thereof.

The summary clause does not necessarily describe all necessary features of the embodiments of the present invention. The present invention may also be a sub-combination of the features described above.

DESCRIPTION OF EXEMPLARY EMBODIMENTS

Hereinafter, an embodiment of the present invention will be described. The embodiment does not limit the invention according to the claims, and all the combinations of the features described in the embodiment are not necessarily essential to means provided by aspects of the invention.

Figure 1:
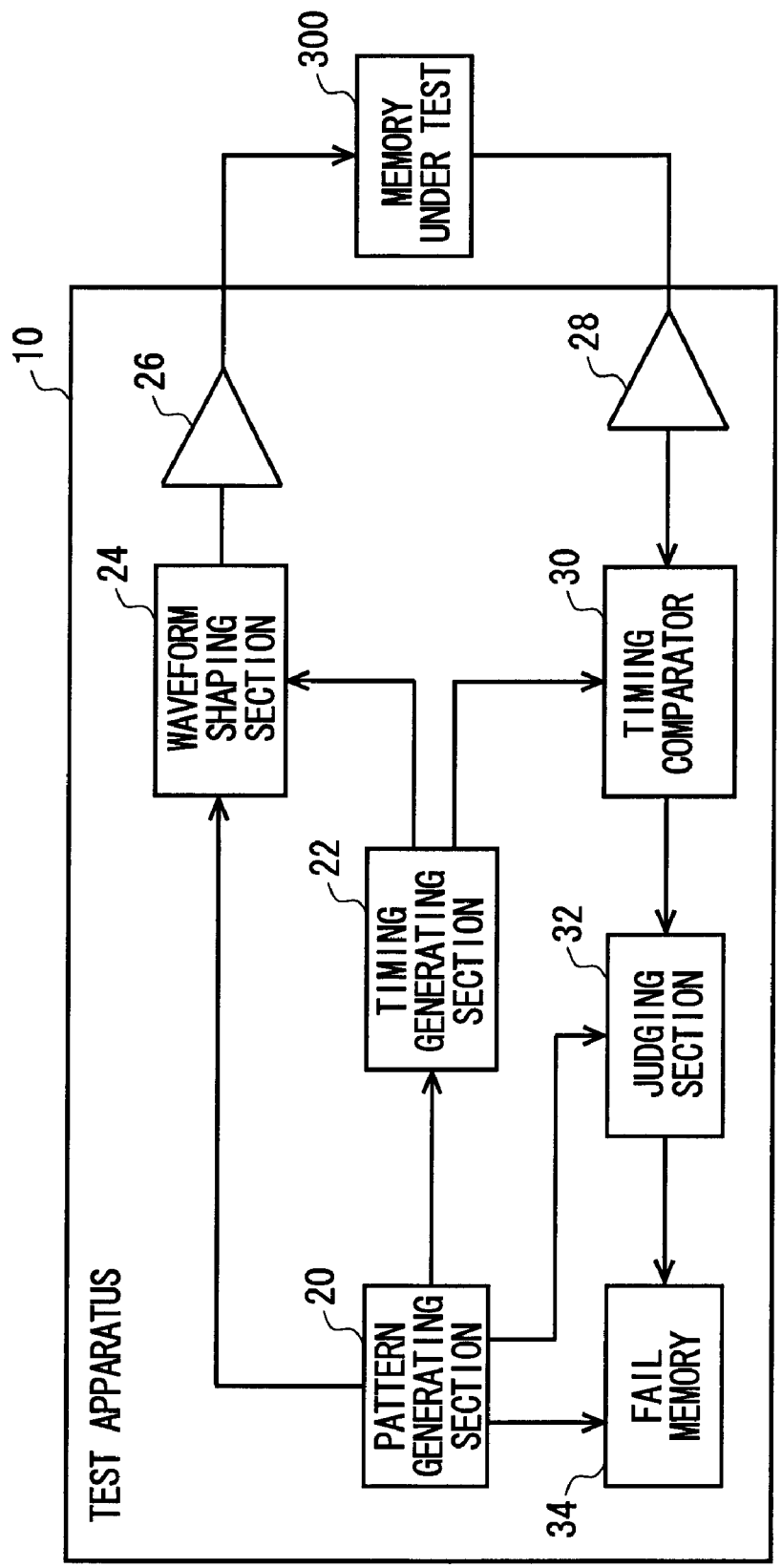
FIG. 1 shows a configuration of a test apparatus 10 in accordance with an embodiment of the invention together with a memory under test 300.

FIG. 1 shows a configuration of a test apparatus 10 in accordance with an embodiment of the invention together with a memory under test 300. The test apparatus 10 feeds a memory under test 300 with a test signal. The test apparatus 10 tests the memory under test 300 by comparing an expected value to a response signal output by the memory under test 300 in response to the test signal. The test apparatus 10 may test other device under test instead of the memory under test 300.

The test apparatus 10 includes a pattern generator 20, a timing generating section 22, a waveform shaping section 24, a driver 26, a level comparator 28, a timing comparator 30, a judging section 32 and a fail memory 34. The pattern generator 20 generates a test pattern specifying a waveform of a test pattern fed to the memory under test 300, and a test pattern representing an expected value of a response signal output by the memory under test 300 in response to feeding of the test signal. The pattern generator 20 may further generate a pattern representing, for example, an address given to the fail memory 34. The pattern generator 20 also generates timing information including a timing of a waveform change (edge) and a timing of comparison between the response signal and the expected value.

The timing generator 22 generates a timing signal specifying a timing at which a signal is communicated to/from the memory under test 300 based on the timing information received from the pattern generator 20. The timing generator 22 may generate, for example, a timing signal specifying a timing of a waveform change in the test signal and a timing signal specifying a timing of comparison between the response signal and the expected value.

The waveform shaping section 24 generates a test signal in which a test pattern is shaped based on the timing signal supplied by the timing generator 22. The waveform shaping section 24 may generate a test signal having, for example, a waveform which is specified by the test pattern and whose level changes in accordance with a timing of the timing signal.

The driver 26 supplies the memory under test 300 with the test signal generated by the waveform shaping section 24. The level comparator 28 receives the response signal output by the memory under test 300 in response to the test signal, and outputs a logical value signal representing a logical value corresponding to a level of the received response signal.

The timing comparator 30 loads, at a timing of the timing signal supplied from the timing generator 22, the logical value which is represented by the logical value signal output from the level comparator 28. The judging section 32 compares the logical value obtained by the timing comparator 30 to the expected value specified by the test pattern that is generated by the pattern generator 20, and outputs a comparison result. When the logical value obtained by the timing comparator 30 matches the expected value, the judging section 32, for example, outputs a comparison result indicating "pass," whereas when the logical value obtained by the timing comparator 30 does not match the expected value, the judging section 32 outputs a comparison result indicating "fail." The fail memory 34 stores judgment results generated by the judging section 32.

Figure 2:
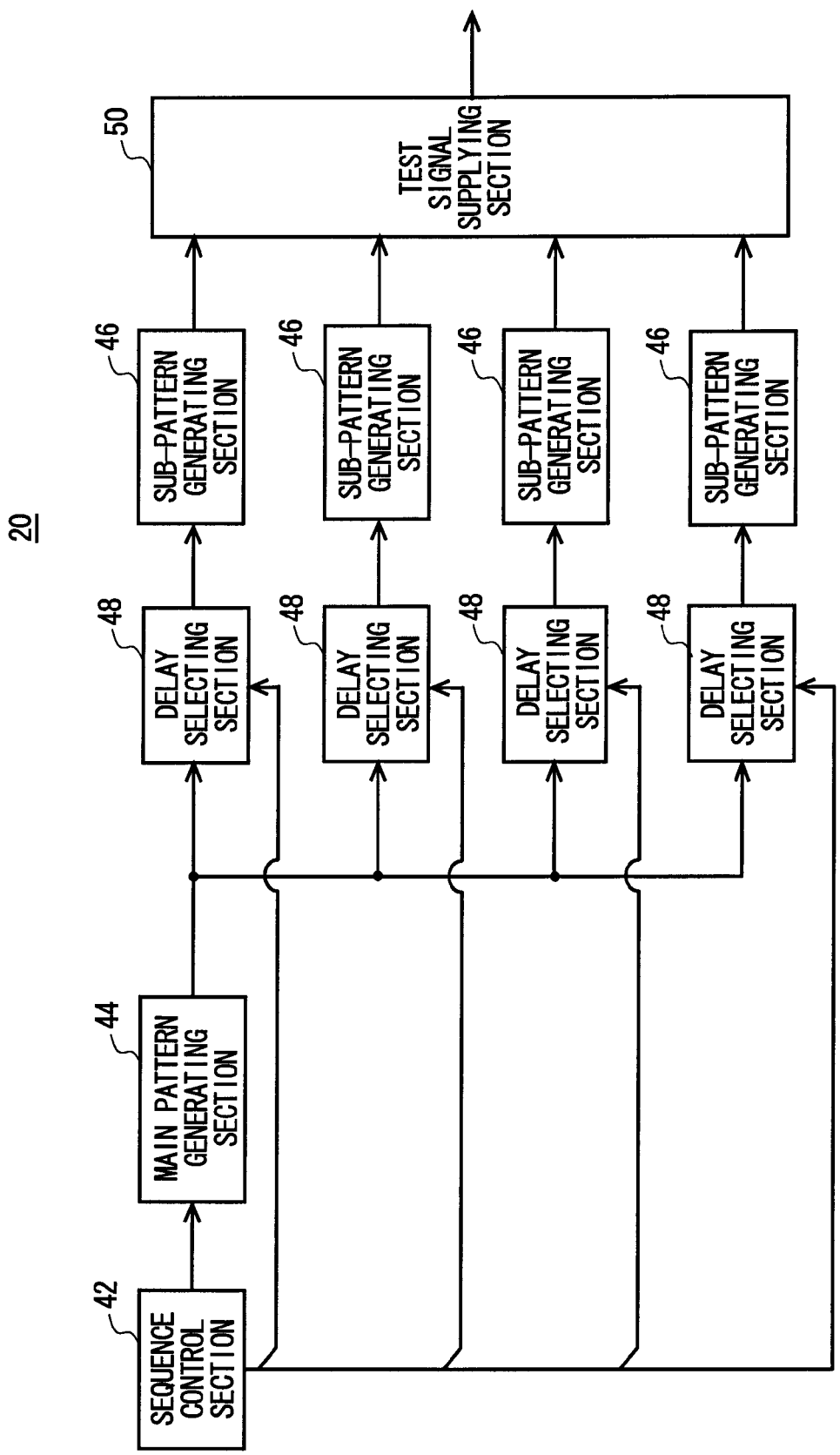
FIG. 2 shows a configuration of a pattern generator 20.

FIG. 2 shows a configuration of the pattern generator 20. The pattern generator 20 includes a sequence control section 42, a main pattern generating section 44, a plurality of sub-pattern generating sections 46, a plurality of delay selecting sections 48 and a test signal supplying section 50.

The sequence control section 42 runs a test program in which a sequence of test instructions which should be sequentially executed is described. When a test is initiated, the sequence control section 42 reads, at each test cycle, one test instruction sequentially from the test instructions described in the test program.

The main pattern generating section 44 generates a main pattern for testing the memory under test 300. More specifically, the main pattern generating section 44 generates, at each test cycle, a main pattern associated with the test instruction which is executed by the sequence control section 42.

When data is burst-transferred to/from the memory under device 300, the main pattern generating section 44 generates, at each test cycle, a main pattern used to generate a plurality of sub-patterns which is burst-transferred to the memory under device 300. In this regard, the main pattern generating section 44 may output, for example, an initial sub-pattern of the sub-patterns which is burst-transferred as the main pattern.

Each of the sub-pattern generating sections 46 receives the main pattern from the main pattern generating section 44 via the corresponding delay selecting section 48 in each test cycle. The sub-pattern generating sections 46 each generate, based on the received main pattern, a sub-pattern corresponding to one of segment cycles consisting the test cycle period.

In other words, each of the sub-pattern generating section 46 corresponds to different one of the segment cycles which is formed by dividing the test cycle period, and generates a sub-pattern according to a position of the corresponding segment cycle in the test cycle and according to the supplied main pattern. Each of the sub-pattern generating sections 46 may generate a sub-pattern by, for example, adding an offset amount corresponding to the position of the segment cycle associated with the sub-pattern generating section in the test cycle period to the main pattern.

When data is burst-transferred to/from the memory under test 300, each of the sub-pattern generating sections 46 may output, for example, a main pattern as a sub-pattern if the associated segment cycle is an initial cycle of the burst transfer. If the associated segment cycle is other than the initial cycle of the burst transfer, each of the sub-pattern generating sections 46 may output, for example, a sub-pattern which is generated based on the main pattern.

Each of the delay selecting sections 48 is provided corresponding to different one of the sub-pattern generating sections 46. Each of the delay selecting sections 48 selects one of a main pattern supplied from the main pattern generating section 44 and a delayed main pattern which is generated by delaying the main pattern supplied from the main pattern generating section 44 by a test cycle, and supplies the selected one to the corresponding sub-pattern generating section 46.

When data is burst-transferred to/from the memory under test 300, each of the delay selecting sections 48 may select the main pattern to supply it to the corresponding sub-pattern generating section 46 when, for example, the corresponding sub-pattern generating section 46 generates a sub-pattern of a burst transfer which will be initiated in a current test cycle. Moreover, each of the delay selecting sections 48 may select the delayed main pattern to supply it to the corresponding sub-pattern generating section 46 when, for example, remaining sub-patterns of a burst transfer which has been initiated in a previous test cycle or before the previous test cycle are to be generated. More specifically, each of the delay selecting sections 48 may select a delayed main pattern that is delayed by one test cycle to supply it to the corresponding sub-pattern generating section 46 when, for example, a remaining sub-pattern of the burst transfer which has been initiated in the previous test cycle or before the previous test cycle are to be generated.

Each of the delay selecting sections 48 may determine whether the corresponding sub-pattern generating section 46 generates the sub-pattern of the burst transfer which will be initiated in the current cycle or one of the remaining sub-patterns of the burst transfer which has been initiated in the previous cycle based on the position of the segment cycle in the test cycle at which the initial sub-pattern of the burst transfer is generated. In other words, each of the delay selecting sections 48 may supply the main pattern of the current test cycle to the sub-pattern generating sections 46 that correspond to segment cycles after the segment cycle at which the initial sub-pattern of the burst transfer is generated in the test cycle. Moreover, each of the delay selecting sections 48 may supply the main pattern of the previous test cycle to the sub-pattern generating sections 46 that correspond to segment cycles before the segment cycle at which the initial sub-pattern of the burst transfer is generated in the test cycle. Furthermore, each of the delay selecting sections 48 may conduct the above-mentioned judgment based on, for example, a control signal supplied by the sequence control section 42.

The test signal supplying section 50 generates a multiplexed test pattern by switching the sub-patterns generated by the sub-pattern generating sections 46 at each of the segment cycles. The test signal supplying section 50 supplies the generated test pattern to the waveform shaping section 24 and feeds the memory under test 300 with a test signal corresponding to the test pattern. The test signal supplying section 50 may further supply the generated test pattern to the judging section 32 and can make the judging section 32 compare the response signal to an expected value corresponding to the test pattern. The test signal supplying section 50 may further provide the generated test pattern to the fail memory 34 as an address in which the judgment result is stored.

Figure 3:
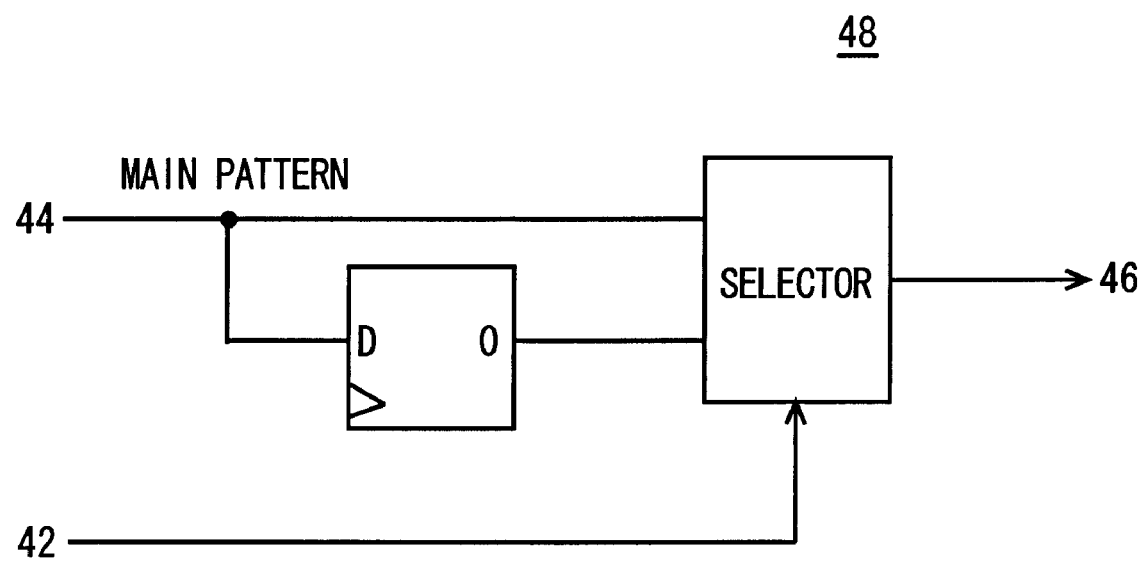
FIG. 3 shows an exemplary configuration of a delay selecting section 48.

FIG. 3 shows an exemplary configuration of the delay selecting section 48. The delay selecting section 48 may include, for instance, a flip-flop 62 and a selector 64.

The flip-flop 62 delays the main pattern generated from the main pattern generating section 44 by a single test cycle and outputs it. The selector 64 selects either the main pattern generated from the main pattern generating section 44 or the delayed main pattern output by the flip-flop 62 depending on the control signal supplied by the sequence control section 42. The selector 64 then feeds the corresponding sub-pattern generating section 46 with the selected main pattern. With such delay selecting section 48, it is possible to supply either the undelayed main pattern or the one-test-cycle delayed main pattern to the corresponding sub-pattern generating section 46.

Figure 4:
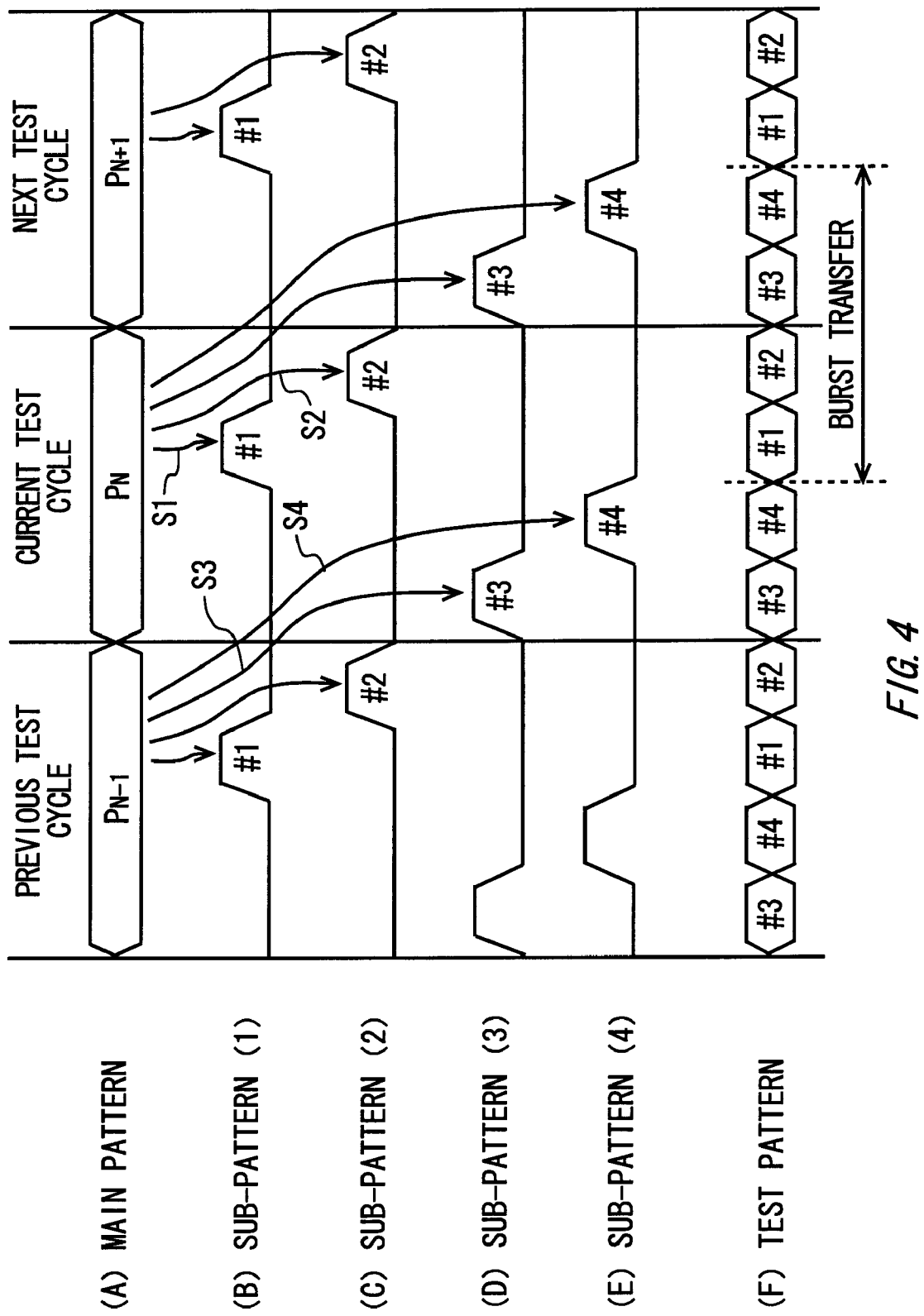
FIG. 4 shows an example of a main pattern, sub-patterns and a test pattern which is formed by multiplexing the sub-patterns, which are generated by the pattern generator 20 that includes four sub-pattern generators 46.

FIG. 4 shows an example of a main pattern, sub-patterns and a test pattern which is formed by multiplexing the sub-patterns, which are generated by the pattern generator 20 that includes the four sub-pattern generators 46. FIG. 4 illustrates an example of the main pattern, the sub-patterns and the test pattern in successive three test cycles (for example, a previous test cycle, a current test cycle and a next test cycle).

FIG. 4(A) shows an example of a timing at which the main pattern is generated by the main pattern generating section 44. FIG. 4(B) shows an example of a timing at which a sub-pattern is generated by a first sub-pattern generating section 46. FIG. 4(C) shows an example of a timing at which a sub-pattern is generated by a second sub-pattern generating section 46.

FIG. 4(D) shows an example of a timing at which a sub-pattern is generated by a third sub-pattern generating section 46. FIG. 4(E) shows an example of a timing at which a sub-pattern is generated by a fourth sub-pattern generating section 46. FIG. 4(E) shows an example of the test pattern after multiplexing the sub-patterns generated by the first to fourth sub-pattern generating sections 46.

As indicated by the arrows S1 and S2 in FIG. 4, the first and second sub-pattern generating sections 46 generate the sub-patterns in the current test cycle based on a main pattern (PN) of the current test cycle. Whereas the third and fourth sub-pattern generating sections 46 generate the sub-patterns in the current test cycle based on a main pattern (PN-1) of the previous test cycle, as indicated by the arrows S3 and S4 in FIG. 4.

In this way, the pattern generator 20 can generate a test pattern irrespective of a position of the interface between a tail sub-pattern that is generated corresponding to the main pattern of the previous test cycle and an initial sub-pattern that is generated corresponding to the main pattern of the current test cycle in the test cycle. Thus, the pattern generator 20 can generate, for example, an initial sub-pattern of a burst transfer at a segment cycle other than the initial segment cycle of the test cycle.

As described above, the test apparatus 10 according to the embodiment can burst-transfer data to/from the memory under test 300 and perform testing of the memory without executing the test program which is adjusted, by inserting a dummy cycle, to generate the initial sub-pattern of the burst transfer is generated at the initial segment cycle of the test cycle. With such test apparatus 10, it is possible to shorten a testing time period and increase the design freedom of test programs.

Figure 5:
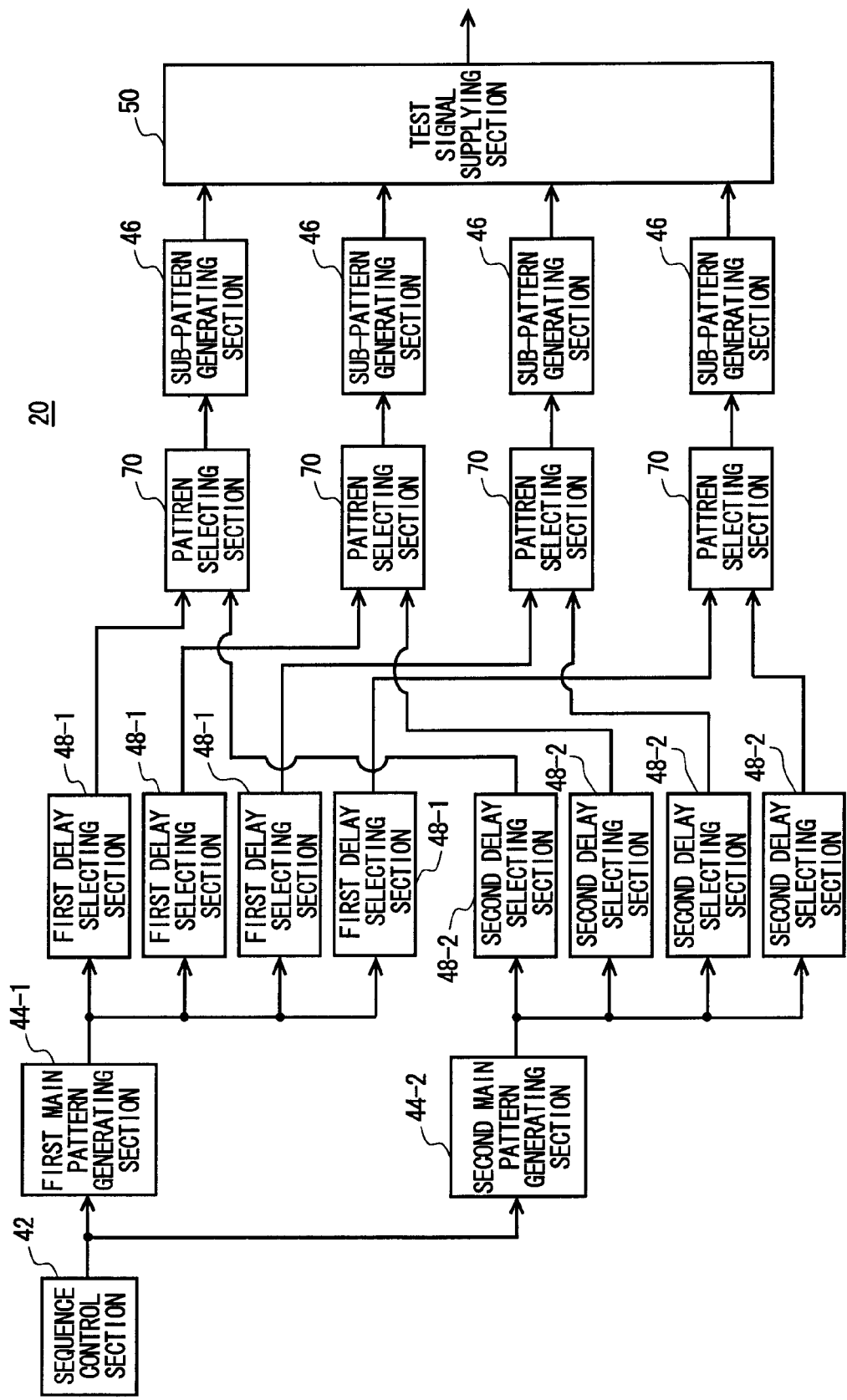
FIG. 5 shows a configuration of the pattern generator 20 according to a modification example of the embodiment.

FIG. 5 shows a configuration of the pattern generator 20 according to a modification example of the embodiment. Since the pattern generator 20 according to the modification example has substantially the same components and features with those of the pattern generator 20 shown in FIG. 2, the identical reference numerals are given to the corresponding members with the same components and features of the pattern generator 20 of FIG. 2 and those explanation will be hereunder omitted except for different points and aspects.

The pattern generator 20 according to the modification example includes the sequence control section 42, a first main pattern generating section 44-1, a second main pattern generating section 44-2, the plurality of sub-pattern generating sections 46, a plurality of first delay selecting sections 48-1, a plurality of second delay selecting sections 48-2, a plurality of pattern selecting sections 70 and the test signal supplying section 50.

The first main pattern generating section 44-1 and the second main pattern generating section 44-2 respectively has the same structure and feature as those of the main pattern generating section 44 shown in FIG. 2. The first main pattern generating section 44-1 and the second main pattern generating section 44-2 can generate two main patterns concurrently in a single test cycle.

The second main pattern generating section 44-2 may generate, for example, a main pattern for the next burst transfer in a case in which a burst transfer based on a main pattern generated by the first main pattern generating section 44-1 is interrupted. More specifically, when the data which is burst-transferred to the memory under test 300 is interrupted in the middle of transferring (in other words, in case of burst chop), the second main pattern generating section 44-2 may generate the main pattern for the next burst transfer.

The plurality of the first delay selecting sections 48-1 are provided corresponding to the first main pattern generating section 44-1 and receive the main pattern from the first main pattern generating section 44-1. Each of the first delay selecting sections 48-1 is provided corresponding to different one of the sub-pattern generating sections 46 and has the same structure and feature as those of the delay selecting section 48 shown in FIG. 2.

The plurality of the second delay selecting sections 48-2 are provided corresponding to the second main pattern generating section 44-1 and receive a main pattern from the second main pattern generating section 44-1. Each of the second delay selecting sections 48-2 is provided corresponding to different one of the sub-pattern generating sections 46 and has the same structure and feature as those of the delay selecting section 48 shown in FIG. 2.

Each of the pattern selecting sections 70 is provided corresponding to different one of the sub-pattern generating sections 46. Each of the pattern selecting sections 70 selects one of the main pattern output from the corresponding first delay selecting sections 48-1 and the main pattern output from the corresponding second first delay selecting sections 48-2, and supplies the selected one to the corresponding sub-pattern generating section 46.

In the test cycle in which the burst transfer based on the main pattern generated by the first main pattern generating section 44-1 is interrupted, for example, the pattern selecting sections 70 may supply the main pattern output from the second delay selecting section 48-2 to the sub-pattern generating section 46 that generates a sub-pattern of the next burst transfer. The pattern selecting sections 70 each may select the corresponding first delay selecting section 48-1 and the corresponding second delay selecting section 48-2 alternately to supply it to the corresponding sub-pattern generating section 46. For instance, the pattern selecting sections 70 each may select the corresponding first delay selecting section 48-1 and the corresponding second delay selecting section 48-2 alternately at prescribed intervals.

With such pattern generator 20 according to the modification example, two different test patterns can be concurrently generated and it is possible to output either one of them by switching them. When a burst transfer is interrupted, thereby the pattern generator 20 can switch to and output the test pattern for the next burst transfer. In this case, the pattern generator 20 can further generate, at a segment cycle other than the initial segment cycle in the test cycle, an initial sub-pattern of the next burst transfer following the burst transfer interrupted. Moreover, the pattern generator 20 can generate two different test patterns in parallel and output them alternately.

While the embodiment of the present invention has been described, the technical scope of the invention is not limited to the above described embodiment. It is apparent to persons skilled in the art that various alterations and improvements can be added to the above-described embodiment. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before" or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A test apparatus testing a device under test comprising:
   a main pattern generating section that generates a main pattern used for testing the device under test at each test cycle;
   a plurality of sub-pattern generating sections each of which generates a sub-pattern corresponding to a different one of segment cycles based on a main pattern, the segment cycles formed by dividing a test cycle period,
   a test signal supplying section that supplies, to the device under test, a multiplexed test pattern formed by switching sub-patterns generated by the plurality of sub-pattern generating sections at each of the segment cycles; and
   a plurality of delay selecting sections each of which selects one of (i) a main pattern that is from the main pattern generating section and (ii) a delayed main pattern that is formed by delaying the main pattern from the main pattern generating section by a test cycle, and supplies the selected one to a corresponding one of the sub-pattern generating sections.

2. The test apparatus according to claim 1, wherein
   the main pattern generating section generates, at each test cycle, a main pattern for producing sub-patterns that are burst transferred to the device under test,
   each of the delay selecting sections selects a main pattern when a corresponding sub-pattern generating section generates a sub-pattern of a burst transfer initiated in a current test cycle, selects a delayed main pattern when the corresponding sub-pattern generating section generates a remaining sub-pattern of a burst transfer that has been initiated in a previous test cycle or before the previous test cycle, and supplies the selected one to the corresponding sub-pattern generating section.

3. The test apparatus according to claim 2, wherein
   the main pattern generating section outputs, as a main pattern, an initial sub-pattern among the sub-patterns that are bust transferred, and
   each of the sub-pattern generating sections outputs the main pattern as the sub-pattern when a corresponding segment cycle is an initial cycle of a burst transfer, and outputs a sub-pattern that is generated based on the main pattern when the corresponding segment cycle is other than the initial cycle of the burst transfer.

4. The test apparatus according to claim 2, comprising:
   a first main pattern generating section and a second main pattern generating section;
   a plurality of first delay selecting sections provided corresponding to the first main pattern generating section;
   a plurality of second delay selecting sections provided corresponding to the second main pattern generating section; and
   a plurality of pattern selecting sections each of which selects one of (i) a main pattern that is output from a corresponding first delay selecting section and (ii) a main pattern that is output from a corresponding second delay selecting section, and supplies the selected one to the corresponding sub-pattern generating section.

5. The test apparatus according to claim 4, wherein
   the second main pattern generating section generates a main pattern for a next burst transfer in a case in which a burst transfer that is based on a main pattern generated by the first main pattern generating section is interrupted, and
   in a test cycle at which the burst transfer based on the main pattern generated by the first main pattern generating section is interrupted, the plurality of the pattern selecting sections supply, to the sub-pattern generating sections that generate sub-patterns of the next bust transfer, the main pattern from the corresponding second delay selecting sections.

6. The test apparatus according to claim 4, wherein
   the first main pattern generating section and the second main pattern generating section generate main patterns in parallel, and
   each of the plurality of pattern selecting sections alternately selects the corresponding first delay selecting section and the second delay selecting section.

7. A testing method performed by a test apparatus testing a device under test, the test apparatus including:
   a main pattern generating section that generates a main pattern used for testing the device under test at each test cycle;
   a plurality of sub-pattern generating sections each of which generates a sub-pattern corresponding to a different one of segment cycles based on a main pattern, the segment cycles formed by dividing a test cycle period; and
   a test signal supplying section that supplies, to the device under test, a multiplexed test pattern formed by switching sub-patterns that are generated by the plurality of sub-pattern generating sections at each of the segment cycles,
   the method comprising:
   selecting one of a main pattern that is from the main pattern generating section and a delayed main pattern that is formed by delaying the main pattern from the main pattern generating section by a test cycle to be supplied to each of the sub-pattern generating sections.

* * * * *